(12) United States Patent
Fuchs et al.

(10) Patent No.: US 12,072,355 B2
(45) Date of Patent: Aug. 27, 2024

(54) APPARATUS AND METHOD FOR MEASURING A FLOW OF CURRENT IN A DIRECTLY COOLED CONDUCTOR

(71) Applicant: Dr. Ing. h.c. F. Porsche Aktiengesellschaft, Stuttgart (DE)

(72) Inventors: Patrick Fuchs, Leonberg (DE); Maximilian Barkow, Stuttgart (DE); Timijan Velic, Weissach (DE); Sebastian Wachter, Pressig (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 205 days.

(21) Appl. No.: 17/883,646

(22) Filed: Aug. 9, 2022

(65) Prior Publication Data
US 2023/0059583 A1  Feb. 23, 2023

(30) Foreign Application Priority Data
Aug. 18, 2021 (DE) ..................... 10 2021 121 410.6

(51) Int. Cl.
*G01R 15/18* (2006.01)
*G01R 19/00* (2006.01)
*H05K 7/20* (2006.01)

(52) U.S. Cl.
CPC ......... *G01R 15/18* (2013.01); *G01R 19/0092* (2013.01); *H05K 7/20927* (2013.01)

(58) Field of Classification Search
CPC .. G01R 15/18; G01R 19/0092; G01R 15/181; G01R 15/207; H05K 7/20927
USPC .......................................................... 324/126
See application file for complete search history.

(56) References Cited

U.S. PATENT DOCUMENTS

| 11,979,063 B2 * | 5/2024 | Takahashi ................ H02K 5/20 |
| 2021/0172980 A1 * | 6/2021 | Jankowski ........... G01R 15/205 |

FOREIGN PATENT DOCUMENTS

| DE | 4412784 C2 * | 4/1997 | ............. G01R 15/04 |
| DE | 102011016966 A1 | 10/2012 | |
| DE | 102017212493 A1 | 8/2018 | |
| WO | WO-2022161913 A1 * | 8/2022 | ............. G01R 15/18 |

* cited by examiner

*Primary Examiner* — Tung X Nguyen
*Assistant Examiner* — Robert P Alejnikov, Jr.
(74) *Attorney, Agent, or Firm* — LEYDIG, VOIT & MAYER, LTD.

(57) ABSTRACT

An apparatus for measuring a flow of current through at least one electrical conductor of an electrotechnical device which is disposed in a cooling channel, wherein a non-conductive cooling medium flows through the cooling channel during operation of the electrotechnical apparatus, the apparatus including a flux conductor which is disposed around the at least one electrical conductor, and an evaluation circuit which is coupled to the flux conductor and is configured to determine the flow of current through the at least one electrical conductor by evaluating an electrical parameter of the flux conductor, wherein at least a part of the flux conductor is disposed in the cooling channel.

10 Claims, 1 Drawing Sheet

APPARATUS AND METHOD FOR MEASURING A FLOW OF CURRENT IN A DIRECTLY COOLED CONDUCTOR

CROSS REFERENCE TO RELATED APPLICATIONS

This application claims benefit to German Patent Application No. DE 10 2021 121 410.6, filed on Aug. 18, 2021, which is hereby incorporated by reference herein.

FIELD

The present invention relates to an apparatus and a method for determining a flow of current in a directly cooled conductor, for example in electrical conductors of a liquid-cooled power electronic system.

BACKGROUND

There are many different ways to measure AC and DC currents, among them also the indirect measurement of current via the measurement of the magnetic field surrounding the current-carrying conductor. This can in turn be measured in a variety of ways, for instance by means of current sensors which operate on the basis of Faraday's law of induction, such as a current transformer or a Rogowski coil, whereby the latter is particularly suitable for measuring high currents, or by means of pure magnetic field sensors, such as a Hall sensor. The level of the current to be measured and the installation space requirement furthermore determine which design the inserted sensor can have. In general, the degree of integration of the sensor decreases with the strength of the current. To measure currents in the range of 200 amperes and more, it is customary to use sensors as separate components in the form of integrated circuits (IC), whereas currents up to about 40 amperes are measured using fully integrated circuits.

Common to all indirect current sensors is that the magnetic field surrounding the current-carrying conductor is "captured" and fed to an electronic evaluation circuit or used to generate a secondary current in a secondary circuit, which can then be determined directly. The ferromagnetic flux conductor of the indirect current sensor and the electronics are typically disposed in a common housing. A through-opening is provided in the housing through which the current-carrying conductor passes, whereby there is an air gap between the two.

SUMMARY

In an embodiment, the present disclosure provides an apparatus for measuring a flow of current through at least one electrical conductor of an electrotechnical device which is disposed in a cooling channel, wherein a non-conductive cooling medium flows through the cooling channel during operation of the electrotechnical apparatus, the apparatus comprising a flux conductor which is disposed around the at least one electrical conductor, and an evaluation circuit which is coupled to the flux conductor and is configured to determine the flow of current through the at least one electrical conductor by evaluating an electrical parameter of the flux conductor, wherein at least a part of the flux conductor is disposed in the cooling channel.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
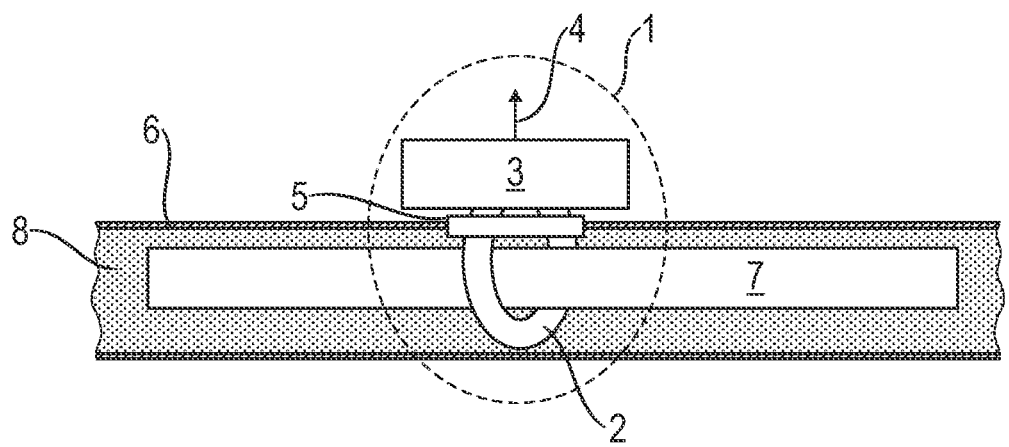
FIG. 1 shows a schematic view of an exemplary apparatus according to the invention for measuring a flow of current through at least one electrical conductor.

In an embodiment, the present invention provides an apparatus, by means of which a flow of current in a directly cooled current conductor can be measured.

In an embodiment of the invention, an apparatus for measuring a flow of current through at least one electrical conductor of an electrotechnical device is provided. The electrical conductor is disposed in a cooling channel, through which a non-conductive cooling medium flows during operation of the electrotechnical device. The electrical conductor is therefore a directly cooled electrical conductor. In the current measuring apparatus according to an embodiment of the invention at least a part of the flux conductor, which is used to capture the magnetic field, so to speak, is disposed in the immediate vicinity of the electrical conductor in which the flow of current is to be determined. This also means that at least a part of the flux conductor is disposed inside the cooling channel in which the electrical conductor is also located. As a result, at least a part of the flux conductor is disposed in an electrically non-conductive medium, which flows through the cooling channel during operation of the electrotechnical device. In the current measuring apparatus according to the invention, there is a spatial separation of the wet and damp spaces, i.e., the compartment in which the cooling fluid is present and the compartment surrounding it, and, depending on the specific embodiment of the current measuring apparatus according to the invention, also a partitioning of the components of the current sensor system, wherein at least a part of the flux conductor is disposed in the wet space. The flux conductor can comprise or consist of a ferromagnetic material.

The electrotechnical device can be a power electronic system, in particular a pulse inverter, which is installed in an electric vehicle, for example. In principle, the electrotechnical system can be any application in which a current measurement is to be carried out in directly liquid-cooled current conductors.

In various embodiments of the invention, an apparatus for measuring a flow of current through at least one electrical conductor of an electrotechnical device is provided, which is disposed in a cooling channel, wherein a non-conductive cooling medium flows through said cooling channel during operation of the electrotechnical apparatus. In an embodiment, the apparatus according to the invention comprises a flux conductor which is disposed around the at least one electrical conductor and an evaluation circuit which is coupled to the flux conductor and is configured to determine the flow of current through the at least one electrical conductor by evaluating an electrical parameter of the flux conductor, wherein at least a part of the flux conductor is disposed in the cooling channel. The remainder of the apparatus according to an embodiment of the invention for measuring the flow of current, in particular the evaluation circuit and its signal output, at which a signal which indicates the size of the determined current is output, can be disposed inside or outside the cooling channel, depending on the embodiment of the apparatus. The flux conductor surrounding the at least one electrical conductor can expediently be round, but can alternatively also have other suitable shapes, such as square with rounded corners. For example, the flux conductor can generally have a shape that is adapted to the electrical conductor such that the distance between the outer surface of the electrical conductor and the inner surface of the flux conductor is constant over its periphery.

In some embodiments, the portion of the cooling channel including the at least one electrical conductor disposed therein can be part of the apparatus according to the invention.

According to some embodiments of the apparatus according to the invention, the flux conductor can be passed through a seal and the part of the flux conductor which is correspondingly located outside of the cooling channel can be coupled to the evaluation circuit. In other words, the seal can act as a parting plane which separates the flux conductor into a part that is disposed inside the cooling channel and a part that is disposed outside the cooling channel. The part of the flux conductor which is disposed outside the cooling channel can then be coupled to the evaluation circuit without any special measures with respect to tightness. The seal can be disposed at a suitable location in the wall of the cooling channel and can be opened or capable of being detached from the cooling channel.

According to some embodiments of the apparatus according to the invention, the entire flux conductor can be disposed inside the cooling channel. In some embodiments, the flux conductor is located in the wet space and is completely surrounded by the cooling medium. The interface between the flux conductor and the evaluation circuit can be located inside the seal.

According to some embodiments of the apparatus according to the invention, the evaluation circuit can be disposed in a fluid-tight housing and mounted in an opening provided in the cooling channel, wherein the housing also closes the opening fluid-tight. In this case, a sealing element can be disposed around the housing in support thereof, e.g., a thread by means of which the housing is screwed into the opening in a fluid-tight manner. In any case, in some embodiments, the housing which is mounted in the opening of the cooling channel is sealed from said opening of the cooling channel.

According to some embodiments of the apparatus according to the invention, the flux conductor can be integrated in the fluid-tight housing of the electronic circuit. In these cases, the apparatus according to the invention can be configured as a module comprising a housing in which the evaluation circuit and the flux conductor are disposed, wherein the module can be mounted, e.g., screwed or pressed, into an opening provided in the wall of the cooling channel.

According to some embodiments of the apparatus according to the invention, the evaluation circuit together with the flux conductor can be disposed in a fluid-tight housing, which is disposed in the cooling channel. In these cases, therefore, the sensor system including the flux conductor and the evaluation circuit is disposed in the housing, which is completely integrated in the cooling channel and surrounded by the cooling medium.

According to some embodiments of the apparatus according to the invention, in which the fluid-tight housing is disposed in the cooling channel, a communication line can be led out of the fluid-tight housing to the outside and led out of the cooling channel in a fluid-tight manner. The communication line is coupled to the signal output of the evaluation circuit, at which a signal which indicates the size of the determined current is output.

According to some embodiments of the apparatus according to the invention, said apparatus can further comprise a communication module which is configured to communicate wirelessly with a communication module disposed outside the cooling channel. The wireless communication module can be part of the evaluation circuit, for example, or can be coupled to it. The wireless communication module can in particular be used to transmit measurement data relating to the determined flow of current from the cooling channel to the outside, so that the wireless communication provided in this manner can be used instead of the aforementioned communication line which passes through the wall of the cooling channel.

In some embodiments of the invention, a power electronics module, in particular a power electronics module of an electric vehicle, comprising at least one directly liquid-cooled electrical conductor is provided, wherein the power electronics module comprises an apparatus for measuring a flow of current through the at least one electrical conductor according to the invention. The power electronics module can be a pulse inverter, for example.

In some embodiments of the invention, a method for measuring a flow of current through at least one electrical conductor of an electrotechnical device disposed in a cooling channel is provided, wherein a non-conductive cooling medium flows through said cooling channel during operation of the electrotechnical apparatus. The flow of current is determined by means of a flux conductor which is disposed around the at least one electrical conductor and by means of an evaluation circuit which is coupled to the flux conductor and is configured to determine the flow of current through the at least one electrical conductor by evaluating an electrical parameter of the flux conductor, wherein at least a part of the flux conductor is disposed in the cooling channel. In further embodiments of the method, the arrangement of the flux conductor and the evaluation circuit relative to one another and relative to the cooling channel can be selected according to any one of the previously described embodiments of the apparatus according to the invention for measuring a flow of current through at least one electrical conductor of an electrotechnical device.

The sensor system of the apparatus according to an embodiment of the invention, which includes the evaluation circuit and the flux conductor, can be any indirect current sensor, so that the flux conductor can be a ferromagnetic (ring) core or a Rogowski coil, for example.

The features mentioned above and those yet to be discussed below can be used not only in the respectively specified combination, but also in other combinations or on their own, without leaving the scope of the present invention.

Figure 2:
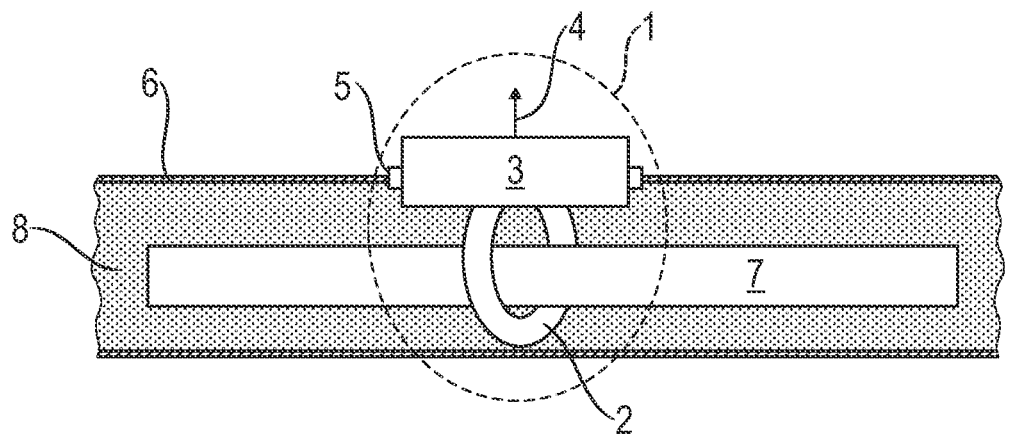
FIG. 2 shows a schematic view of an exemplary apparatus according to the invention for measuring a flow of current through at least one electrical conductor.
Figure 3:
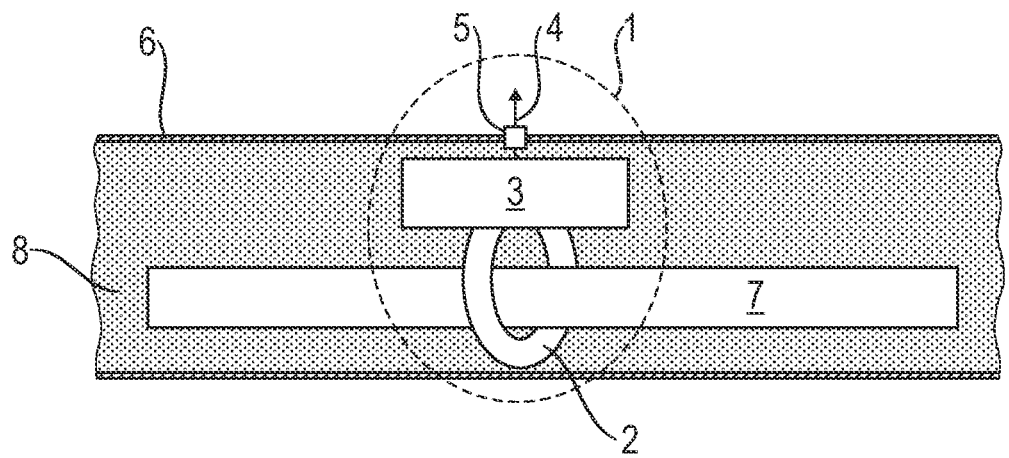
FIG. 3 shows a schematic view of an exemplary apparatus according to the invention for measuring a flow of current through at least one electrical conductor.

FIGS. 1-3 show schematic views of different design examples of the apparatus 1 according to the invention. The basic structure, namely an electrical conductor 7 which is disposed in a cooling channel 6 and is surrounded by a cooling medium 8 or around which said cooling medium flows during operation of the associated electrotechnical device and on which an indirect current measurement is to be carried out by means of a flux conductor 2 and an evaluation circuit 3 coupled thereto. The evaluation circuit 3 comprises a signal output 4, at which a signal which indicates the size of the determined current is output. Common to all of the embodiments shown in FIGS. 1-3 is that the flux conductor 2 is disposed at least partly in the cooling channel.

In the design example of the apparatus 1 according to the invention shown in FIG. 1, the flux conductor 2 is fastened in the seal 5 which seals an opening provided in the wall of the cooling channel 6. The part of the flux conductor 2 disposed outside the cooling channel is coupled to the evaluation circuit 3.

In the design example of the apparatus 1 according to the invention shown in FIG. 2, the sensor system comprising the evaluation circuit 3 and the flux conductor 2 is part of the sealing concept and is disposed in a closed housing. This housing is mounted in the opening in the wall of the cooling channel 6 and sealed with respect to it. The sealing element 5 can be disposed on or integrally formed with the housing.

FIG. 3 lastly shows a third design example of the apparatus 1 according to the invention. In this design example, too, the sensor system is disposed in a closed housing. It is completely integrated in the cooling channel 6 and the cooling medium 8 flows around it. The signal output 4 of the evaluation circuit is led to the outside through the seal provided in the wall of the cooling channel 6 in a fluid-tight manner.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An apparatus for measuring a flow of current through at least one electrical conductor of an electrotechnical device which is disposed in a cooling channel, wherein a non-conductive cooling medium flows through the cooling channel during operation of the electrotechnical apparatus, the apparatus comprising:
   a flux conductor which is disposed around the at least one electrical conductor; and
   an evaluation circuit which is coupled to the flux conductor and is configured to determine the flow of current through the at least one electrical conductor by evaluating an electrical parameter of the flux conductor,
   wherein at least a part of the flux conductor is disposed in the cooling channel.

2. The apparatus according to claim 1, wherein the flux conductor is passed through a seal and a part of the flux conductor which is correspondingly located outside the cooling channel is coupled to the evaluation circuit.

3. The apparatus according to claim 1, wherein the entire flux conductor is disposed inside the cooling channel.

4. The apparatus according to claim 3, wherein the evaluation circuit is disposed in a fluid-tight housing and is mounted in an opening provided in the cooling channel, and wherein the housing also closes the opening in a fluid-tight manner.

5. The apparatus according to claim 4, wherein the flux conductor is integrated in the fluid-tight housing of the evaluation circuit.

6. The apparatus according to claim 3, wherein the evaluation circuit together with the flux conductor is disposed in a fluid-tight housing, which is disposed in the cooling channel.

7. The apparatus according to claim 6, wherein a communication line is led out of the fluid-tight housing to the outside and is led out of the cooling channel in a fluid-tight manner.

8. The apparatus according to claim 6, further comprising:
   a communication module which is configured to communicate wirelessly with a communication module disposed outside the cooling channel.

9. A power electronics module, having at least one directly liquid-cooled electrical conductor, wherein the power electronics module comprises an apparatus for measuring a flow of current through the at least one electrical conductor according to claim 1.

10. A method for measuring a flow of current through at least one electrical conductor of an electrotechnical apparatus which is disposed in a cooling channel, wherein a non-conductive cooling medium flows through the cooling channel during operation of the electrotechnical apparatus,
   wherein the flow of current is determined by means of a flux conductor which is disposed around the at least one electrical conductor and an evaluation circuit which is coupled to the flux conductor and is configured to determine the flow of current through the at least one electrical conductor by evaluating an electrical parameter of the flux conductor;
   wherein at least a part of the flux conductor is disposed in the cooling channel.

* * * * *